United States Patent
Chen et al.

(10) Patent No.: US 9,556,017 B2
(45) Date of Patent: Jan. 31, 2017

(54) APPARATUS AND METHOD FOR PREVENTING STICTION OF MEMS DEVICES ENCAPSULATED BY ACTIVE CIRCUITRY

(71) Applicant: Analog Devices, Inc., Norwood, MA (US)

(72) Inventors: Li Chen, Belmont, MA (US); Thomas Kieran Nunan, Carlisle, MA (US); Kuang L. Yang, Newton, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/926,257

(22) Filed: Jun. 25, 2013

(65) Prior Publication Data
US 2014/0374856 A1    Dec. 25, 2014

(51) Int. Cl.
*B81B 3/00*    (2006.01)
*B81C 1/00*    (2006.01)

(52) U.S. Cl.
CPC ............ *B81B 3/0051* (2013.01); *B81B 3/0005* (2013.01); *B81B 3/0059* (2013.01); *B81C 1/00976* (2013.01); *B81B 2207/012* (2013.01); *B81C 2201/112* (2013.01); *B81C 2203/0118* (2013.01)

(58) Field of Classification Search
CPC .............. H01L 21/311; H01L 21/31116; B81C 2203/0118; B81C 3/0051; B81C 3/0059
USPC ..................................... 438/50, 52
See application file for complete search history.

(56) References Cited

U.S. PATENT DOCUMENTS

| | | | |
|---|---|---|---|
| 5,719,069 A | 2/1998 | Sparks | 437/59 |
| 5,719,336 A | 2/1998 | Ando et al. | 73/514.32 |
| 5,864,063 A | 1/1999 | Otani et al. | 73/514.32 |
| 5,955,380 A | 9/1999 | Lee | 438/706 |
| 6,117,791 A * | 9/2000 | Ko et al. | 438/723 |
| 6,405,592 B1 | 6/2002 | Murari et al. | 73/493 |
| 6,559,487 B1 | 5/2003 | Kang et al. | 257/254 |
| 6,841,992 B2 | 1/2005 | Yue et al. | 324/162 |
| 6,921,965 B1 * | 7/2005 | Ray et al. | 257/659 |
| 7,140,250 B2 | 11/2006 | Leonardson et al. | 73/504.14 |
| 7,146,856 B2 | 12/2006 | Malametz | 73/514.32 |
| 7,610,809 B2 | 11/2009 | McNeil et al. | 73/514.32 |
| 7,736,931 B1 | 6/2010 | Guo | 438/52 |
| 8,146,425 B2 | 4/2012 | Zhang et al. | 73/514.32 |

(Continued)

FOREIGN PATENT DOCUMENTS

| | | | |
|---|---|---|---|
| EP | 0 951 068 | 10/1999 | H01L 23/10 |
| EP | 1 808 405 | 7/2007 | B81C 1/00 |

OTHER PUBLICATIONS

Singer, Peter "The Future of Dielectric CVD: High-Density Plasmas?", Semiconductor International, Cahners Publishing, vol. 20, No. 8, dated Jul. 1997, 6 pages.

(Continued)

*Primary Examiner* — Yu-Hsi D Sun
(74) *Attorney, Agent, or Firm* — Sunstein Kann Murphy & Timbers LLP (57) ABSTRACT

One or more stopper features (e.g., bump structures) are formed in a standard ASIC wafer top passivation layer for preventing MEMS device stiction vertically in integrated devices having a MEMS device capped directly by an ASIC wafer. A TiN coating may be used on the stopper feature(s) for anti-stiction. An electrical potential may be applied to the TiN anti-stiction coating of one or more stopper features.

20 Claims, 6 Drawing Sheets

(56) References Cited

U.S. PATENT DOCUMENTS

| | | | |
|---|---|---|---|
| 2002/0197795 A1* | 12/2002 | Saito .............................. | 438/257 |
| 2004/0130033 A1* | 7/2004 | Masamitsu ....... | H01L 21/76828 |
| | | | 257/760 |
| 2004/0248361 A1* | 12/2004 | Oh et al. ...................... | 438/240 |
| 2005/0109109 A1 | 5/2005 | Eskridge et al. .......... | 73/514.32 |
| 2007/0164378 A1 | 7/2007 | MacGugan ................... | 257/416 |
| 2007/0190680 A1 | 8/2007 | Fukuda et al. .................. | 438/50 |
| 2008/0238257 A1* | 10/2008 | Kawakubo et al. .......... | 310/328 |
| 2009/0145229 A1 | 6/2009 | Gabara ....................... | 73/514.32 |
| 2010/0207216 A1 | 8/2010 | Drews et al. .................. | 257/415 |
| 2010/0242600 A1 | 9/2010 | Lin et al. ................... | 73/504.12 |
| 2012/0126433 A1* | 5/2012 | Montanya Silvestre ..... | 257/787 |
| 2012/0313189 A1* | 12/2012 | Huang et al. ................. | 257/415 |
| 2013/0127036 A1 | 5/2013 | Kuo et al. ...................... | 257/704 |
| 2013/0319076 A1* | 12/2013 | Moreau .......................... | 73/1.38 |
| 2013/0333471 A1 | 12/2013 | Chien ........................ | 73/514.32 |
| 2014/0374850 A1 | 12/2014 | Chen et al. ................... | 257/415 |

OTHER PUBLICATIONS

International Searching Authority International Search Report—International Application No. PCT/US2014/043789, dated Oct. 1, 2014, together with the Written Opinion of the International Searching Authority, 13 pages.
Taiwan IPO, Official Letter—Application No. 103121735, dated Jun. 13, 2016, 7 pages.
Taiwan IpO, Search Report—Application No. 103121735, dated Jun. 13, 2016, 1 page.

\* cited by examiner

APPARATUS AND METHOD FOR PREVENTING STICTION OF MEMS DEVICES ENCAPSULATED BY ACTIVE CIRCUITRY

CROSS-REFERENCE TO RELATED APPLICATION(S)

The subject matter of this patent application may be related to the subject matter of United States Patent Application entitled APPARATUS AND METHOD FOR SHIELDING AND BIASING IN MEMS DEVICES ENCAPSULATED BY ACTIVE CIRCUITRY filed on even date herewith (Ser. No. 13/926,384), which is hereby incorporated herein by reference in its entirety.

FIELD OF THE INVENTION

The present invention relates generally to anti-stiction techniques in an integrated wafer-level chip scale package having a MEMS wafer capped with an ASIC wafer.

BACKGROUND OF THE INVENTION

In a MEMS device, movable MEMS structures are often prone to stiction laterally and/or vertically. In surface micromachined MEMS devices such as accelerometers and gyroscopes, lateral and/or underside stoppers (e.g., bump structures) are often included on the MEMS wafer to prevent over-range movement of the movable MEMS structures. These stoppers are typically configured to have a small contact area with the movable MEMS structures in order to reduce the chance for stiction of the movable MEMS structures to the stoppers. An anti-stiction coating is often also used to enhance anti-stiction performance.

For capped MEMS devices (i.e., where a cap, such as a "dummy" silicon wafer, is bonded to the MEMS device wafer), it also is typical to have vertical stoppers on a cap cavity above the movable MEMS structures, especially when the cavity between the MEMS wafer and the cap is shallow and the movable MEMS structures are in close proximity to structures on the cap.

It is known to bond an ASIC wafer to a MEMS wafer to form an integrated wafer-level chip scale package. In such an integrated wafer-level chip scale package, the ASIC wafer is effectively the cap wafer. Depending on the bond seal material thickness or patterned standoff depth, such devices often have a cavity depth on the order of approximately 2-4 micrometers (abbreviated "um" herein). In such devices, the movable MEMS structures are particularly prone to stiction due to the close proximity of movable MEMS structures to a substantially flat ASIC surface.

SUMMARY OF EXEMPLARY EMBODIMENTS

In a first embodiment there is provided a method for forming stopper features on an ASIC wafer having a top circuitry layer. The method involves forming HDP-OX layer above the top circuitry layer; forming a passivation layer on the HDP-OX etch-stop layer; and selectively etching the passivation layer to form at least one stopper feature, wherein the HDP-OX is an etch-stop layer for patterning the passivation layer.

In various alternative embodiments, forming the passivation layer may include forming a bottom oxide layer, a middle nitride layer, and a top oxide layer, and selectively etching the passivation layer may involve using a CF4 etchant containing H2 to selectively etch through the top oxide layer and the middle nitride layer and introducing CHF3 or CH2F2 into the etchant to selectively etch through the bottom oxide layer to the HDP-OX layer. Additionally or alternatively, the method may involve forming a TiN anti-stiction coating on at least one stopper feature, in which case the method may further involve forming circuitry configured to place an electrical potential on the TiN anti-stiction coating. Forming a TiN anti-stiction coating on at least one stopper feature may involve forming a TiN anti-stiction coating on each of a plurality of stopper features. Forming a TiN anti-stiction coating on each of a plurality of stopper features may involve forming at least two stopper features having TiN anti-stiction coatings that are electrically connected to one another, in which case the method may further involve forming circuitry configured to place an electrical potential on the electrically connected TiN anti-stiction coatings. Additionally or alternatively, forming a TiN anti-stiction coating on each of a plurality of stopper features may involve forming at least two stopper features having TiN anti-stiction coatings that are electrically isolated from one another, in which case the method may further involve forming circuitry capable of placing different electrical potentials on the electrically isolated TiN anti-stiction coatings. In any of the above-described embodiments, the method may involve forming a plurality of AlCu standoffs.

In another embodiment there is provided an ASIC wafer comprising a top circuit layer; an HDP-OX layer formed above the top circuit layer; and a passivation layer formed on the HDP-OX layer and selectively etched to include at least one stopper feature.

In various alternative embodiments, the passivation layer may include a bottom oxide layer, a middle nitride layer, and a top oxide layer. Additionally or alternatively, the ASIC wafer may include a TiN anti-stiction coating on at least one stopper feature, in which case the ASIC wafer may include circuitry configured to place an electrical potential on the TiN anti-stiction coating. The ASIC wafer may include a TiN anti-stiction coating on each of a plurality of stopper features. At least two stopper features may have TiN anti-stiction coatings that are electrically connected to one another and the ASIC wafer may include circuitry configured to place an electrical potential on the electrically connected TiN anti-stiction coatings. Additionally or alternatively, at least two stopper features may have TiN anti-stiction coatings that are electrically isolated from one another and the ASIC wafer may include circuitry capable of placing different electrical potentials on the electrically isolated TiN anti-stiction coatings. In any of the above-described embodiments, the ASIC wafer may include a plurality of AlCu standoffs.

In another embodiment there is provided an integrated wafer-level chip scale package device comprising an ASIC wafer coupled to a MEMS device, wherein the MEMS device includes at least one movable MEMS structure and wherein the ASIC wafer comprises a top circuit layer, an HDP-OX layer formed above the top circuit layer, and a passivation layer formed on the HDP-OX layer and selectively etched to include at least one stopper feature positioned to act as a vertical stopper for a movable MEMS structure.

In various alternative embodiments, the passivation layer may include a bottom oxide layer, a middle nitride layer, and a top oxide layer. Additionally or alternatively, the device may include a TiN anti-stiction coating on at least one stopper feature, in which case the device may include circuitry configured to place an electrical potential on the TiN anti-stiction coating. The device may include a TiN anti-stiction coating on each of a plurality of stopper features. At least two stopper features may have TiN anti-stiction coatings that are electrically connected to one another and the device may include circuitry configured to place an electrical potential on the electrically connected TiN anti-stiction coatings. Additionally or alternatively, at least two stopper features may have TiN anti-stiction coatings that are electrically isolated from one another and the device may include circuitry capable of placing different electrical potentials on the electrically isolated TiN anti-stiction coatings. In any of the above-described embodiments, the device may include a plurality of AlCu standoffs.

Additional embodiments may be disclosed and claimed.

BRIEF DESCRIPTION OF THE DRAWINGS

The foregoing features of embodiments will be more readily understood by reference to the following detailed description, taken with reference to the accompanying drawings, in which:

FIG. 2 comprising FIGS. 2A-2G schematically shows pertinent steps of an exemplary fabrication process for forming a stopper feature, in accordance with one exemplary embodiment;

It should be noted that the foregoing figures and the elements depicted therein are not necessarily drawn to consistent scale or to any scale. Unless the context otherwise suggests, like elements are indicated by like numerals.

DETAILED DESCRIPTION OF SPECIFIC EMBODIMENTS

In exemplary embodiments of the present invention, one or more stopper features (e.g., bump structures) are formed in a standard ASIC wafer top passivation layer for preventing MEMS device stiction vertically in integrated devices having a MEMS device capped directly by an ASIC wafer.

As discussed below, in one exemplary embodiment, formation of a stopper feature on an ASIC capping active circuit passivation layer surface involves forming a High-Density Plasma oxide (HDP-OX) etch-stop layer above the top active circuitry layer of an ASIC wafer, forming a passivation layer (e.g., an oxide-nitride-oxide passivation layer) on the HDP-OX etch-stop layer, patterning the passivation layer to form a stopper feature (and using the underlying HDP-OX layer as an etch-stop layer during the patterning of the passivation layer). In certain exemplary embodiments, formation of the stopper feature is optionally followed by a standard ASIC top metal layer deposition (e.g., TiN+AlCu) on top of the stopper feature, followed by chemical etching of the top AlCu to leave just the TiN anti-stiction coating on the stopper feature.

Figure 1:
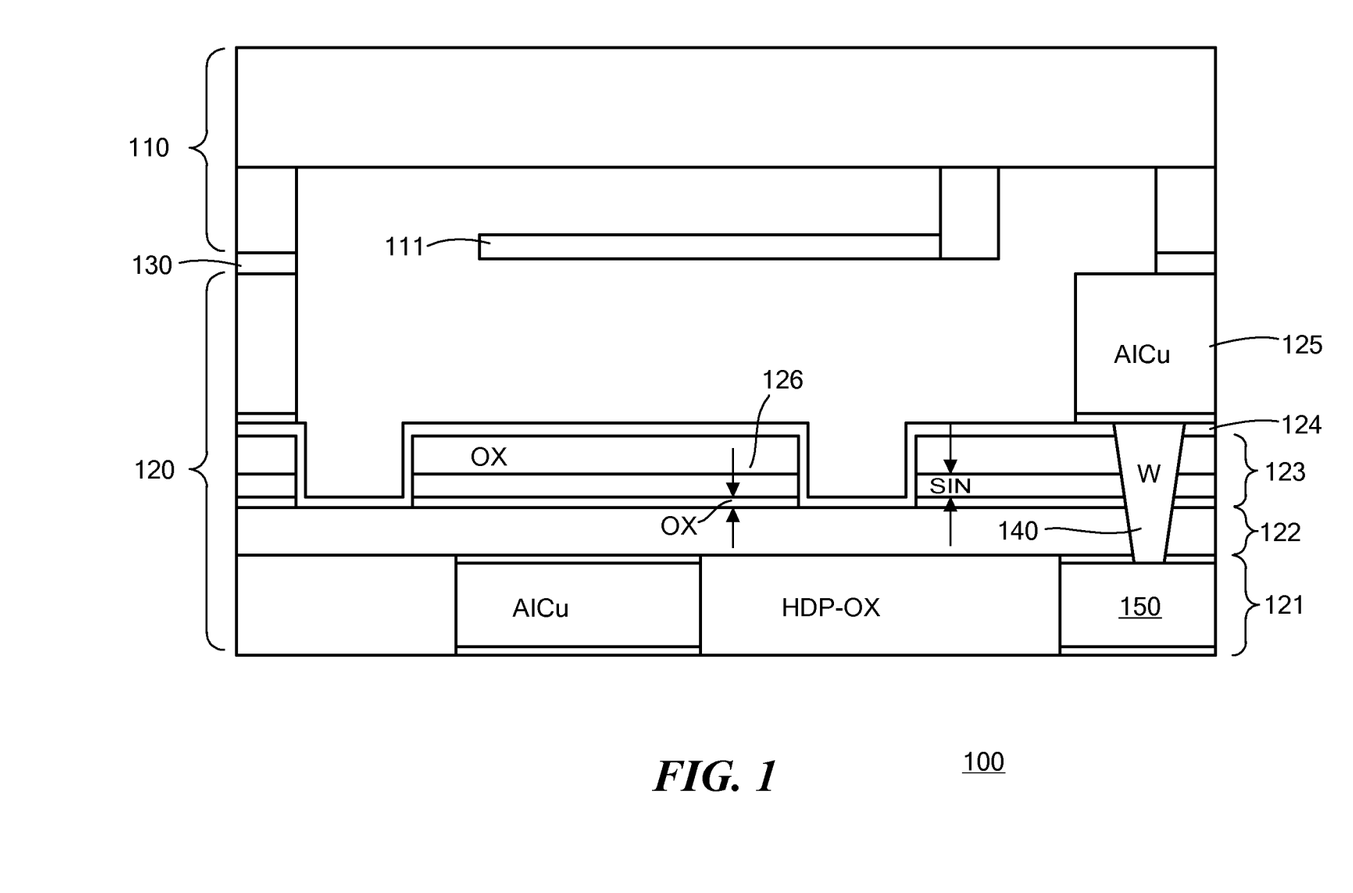
FIG. 1 is a schematic block diagram showing a cross-sectional view of wafer-level chip scale package in accordance with one exemplary embodiment of the present invention.

FIG. 1 is a schematic block diagram showing a cross-sectional view of wafer-level chip scale package 100 in accordance with one exemplary embodiment of the present invention. A MEMS wafer 110 having a movable MEMS structure 111 is bonded to a CMOS ASIC wafer 120 via a bonding material 130. As discussed more fully below, the ASIC wafer 120 is formed as a layered structure including, among other things, a top circuitry layer 121, a high-density plasma oxide (HDP-OX) etch-stop layer 122 formed above the top circuitry layer 121, a passivation layer 123 formed on the HDP-OX etch-stop layer 122 and having formed therein a stopper feature 126, an optional anti-stiction layer 124 formed on the passivation layer 123, and optional standoff structures 125 formed on the anti-stiction layer 124 or formed directly on the passivation layer 123 (e.g., in certain exemplary embodiments, the anti-stiction layer 124 may be omitted or portions of the anti-stiction layer 124 may be removed from the standoff locations prior to formation of the standoffs).

In this exemplary embodiment, the passivation layer is formed of three sub-layers, specifically a thin bottom oxide layer (e.g., silicon dioxide or SiO2), a thin middle nitride layer (e.g., silicon nitride or SiN), and a thicker top oxide (OX) layer (e.g., silicon dioxide or SiO2). Alternative embodiments may use other passivation materials. In this exemplary embodiment, the anti-stiction layer is formed of Titanium Nitride (TiN). Alternative embodiments may use other anti-stiction materials or may omit an anti-stiction material. In this exemplary embodiment, an electrically conductive via 140 couples the anti-stiction layer 124 to an electrode 150 in the circuitry layer 121, e.g., to allow an electric signal to be placed on some or all of the anti-stiction coating 124 (e.g., in certain exemplary embodiments, an electric signal may be placed on just the portion of the anti-stiction coating on the stopper feature).

As discussed more fully below, the stopper feature 126 is formed in the ASIC wafer top passivation layer opposite the movable MEMS structure 111. It should be noted that, although this exemplary embodiment shows one stopper feature 126, alternative embodiments may have multiple stopper features, e.g., one or more stopper features for each of a number of movable MEMS structures.

Pertinent steps of an exemplary fabrication process for forming the stopper feature 126 are now described with reference to FIG. 2.

Figure 2A:
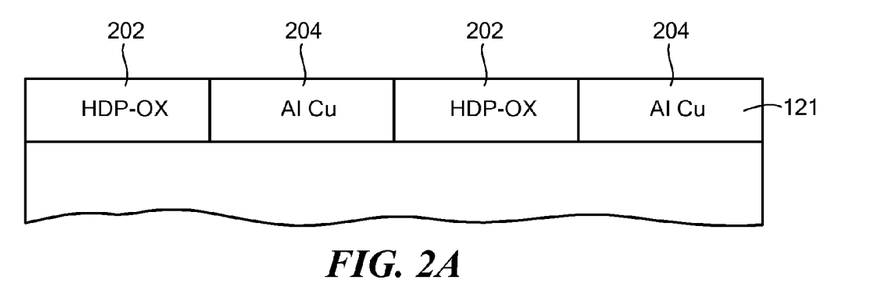

FIG. 2A shows a cross-sectional view of an exemplary top circuitry layer 121 of an ASIC wafer. In this example, the top circuitry layer 121 includes metal bond pads 204 (in this example, AlCu bond pads) coupled to underlying circuitry (not shown for convenience) and electrically insulated from one another by electrical insulators 202 (in this example, HDP-OX).

Figure 2B:
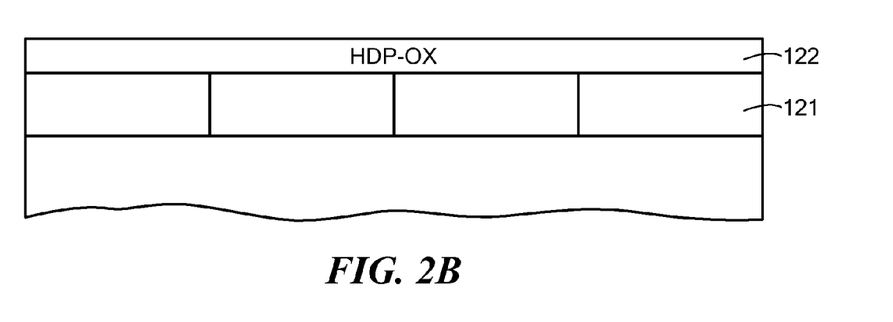

As shown in FIG. 2B, an HDP-OX etch-stop layer 122 is formed on the top circuitry layer 121. In an exemplary embodiment, this HDP-OX layer is formed by alternately depositing HDP-OX material and planarizing the deposited HDP-OX material until the desired HDP-OX thickness is reached (which may be different for different embodiments). In addition to acting as an etch-stop layer during patterning of the passivation layer 123, the HDP-OX etch-stop layer 122 acts to separate the anti-stiction layer 124 (if present) from the metal bond pads 204.

Figure 2C:
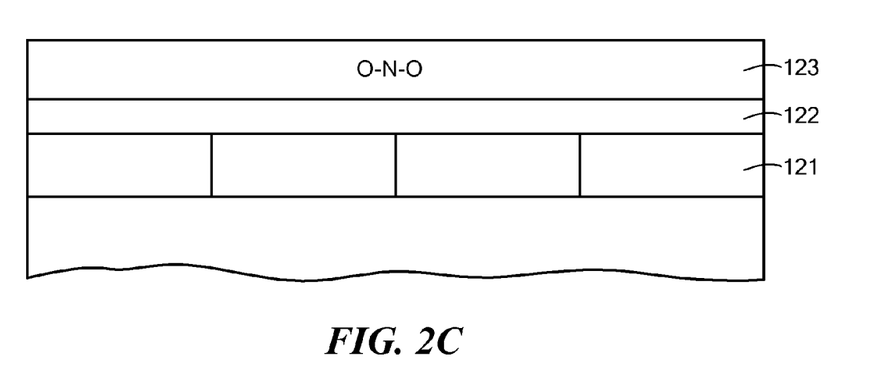

As shown in FIG. 2C, the passivation layer 123 is formed on the HDP-OX layer 122. As discussed above, the passivation layer 123 in this exemplary embodiment includes three sub-layers, specifically a thin bottom oxide layer (e.g., SiO2), a thin middle nitride layer (e.g., SiN), and thicker a top oxide layer (e.g., SiO2). This oxide-nitride-oxide (O—N—O) passivation layer 123 is typically on the order of around 0.25-0.3 um thick. In certain exemplary embodiments, the oxide sub-layers and nitride sub-layer of the passivation layer 123 are formed using Plasma Enhanced Chemical Vapor Deposition (PECVD) at temperatures below around 450 degrees Celsius. It should be noted that the HDP-OX etch-stop layer 122 has a substantially slower etch rate than the oxide-nitride-oxide passivation layer 123, e.g., on the order of around 10-30 times the etch rate of the oxide-nitride-oxide passivation layer 123.

Figure 2D:
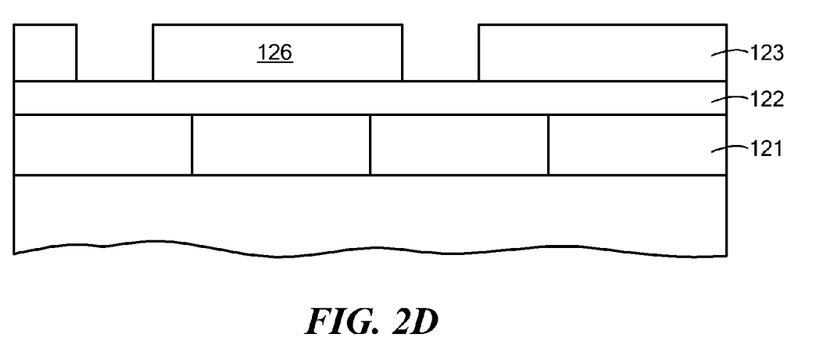

As shown in FIG. 2D, the passivation layer 123 is selectively etched to form, among other things, the stopper feature 126. During this selective etching process, the HDP-OX layer 122 is used as an etch-stop layer. In this exemplary embodiment using an oxide-nitride-oxide passivation layer 123, a fluorine-based etchant is typically used to selectively etch the passivation layer 123, as fluorine can etch both oxide and nitride. In one exemplary embodiment, CF4 mixed with a small amount H2 is used to vertically etch down through the top oxide layer and the middle nitride layer, and when the bottom oxide layer is reached, CHF3 or CH2F2 is introduced to slow down oxide etching and stop the etching when it reaches the HDP-OX layer (with less fluorine in the gas, it tends to etch less oxide and even less of the HDP-OX layer).

Figure 2E:
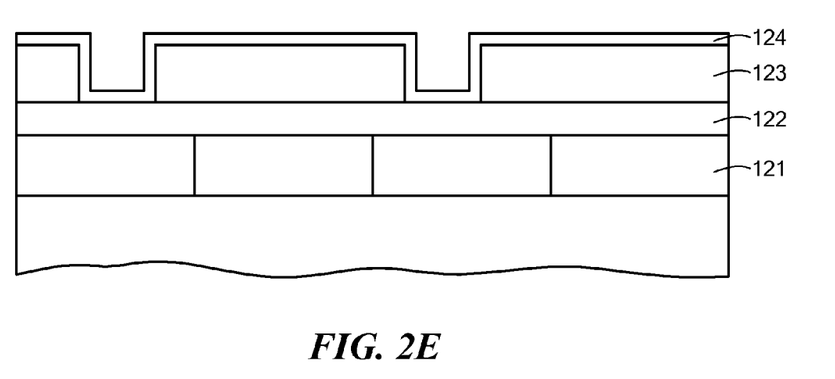

As shown in FIG. 2E, after selective etching of the passivation layer 123 to form the stopper feature 126, a TiN anti-stiction layer 124 is optionally formed on at least a portion of the exposed surface of the selectively etched passivation layer 123 (typically covering at least the top surface of the stopper feature 126). The TiN anti-stiction layer 124 is typically on the order of around 50-100 nm (nanometers) thick, preferably closer to 50 nm. As mentioned above, in certain embodiments, the TiN anti-stiction layer 124 is omitted. Thus, it should be noted that the height of the stopper feature 126 is generally determined by the top passivation layer stack thickness (typically on the order of around 0.25-0.3 um) and, if present, the TiN anti-stiction coating thickness (typically on the order of around 50-100 nm).

Figure 2F:
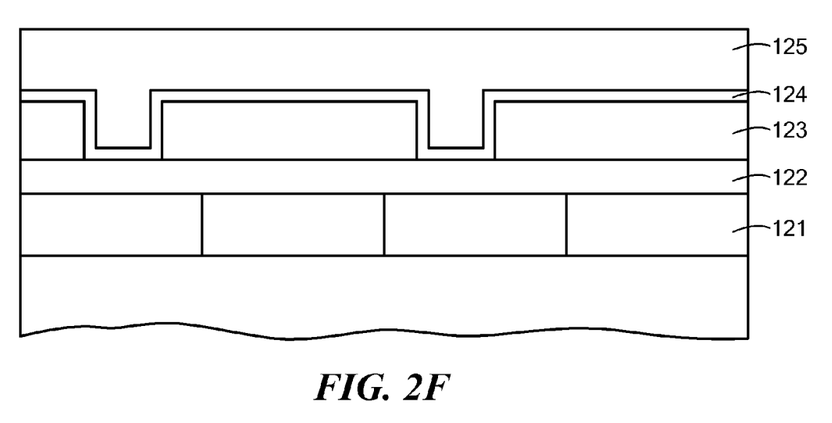

As shown in FIG. 2F, after the TiN anti-stiction layer 124 is formed, a standoff layer 125 is formed on the TiN anti-stiction layer 124. In this exemplary embodiment, the standoff layer 125 is formed of AlCu. The standoff layer 125 is typically on the order of around 2-4 um thick. In certain alternative embodiments, the standoff layer 125 may be omitted. In certain alternative embodiments in which the TiN anti-stiction layer is omitted, the standoff layer 125 may be formed directly on the passivation layer 123. In certain alternative embodiments, portions of the anti-stiction layer 124 may be removed from the standoff locations prior to formation of the standoff layer 125.

Figure 2G:
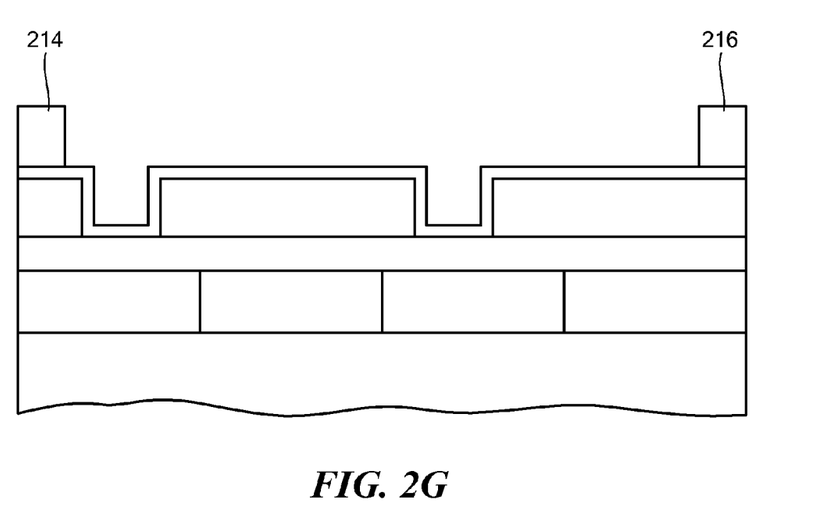

As shown in FIG. 2G, the standoff layer 125 is chemically etched to form standoffs 214 and 216, which form bonding surfaces for bonding the ASIC wafer 120 to the MEMS wafer 110 and also act to provide a minimum separation between the ASIC wafer 120 and the MEMS wafer 110. In exemplary embodiments that include the TiN anti-stiction layer 124, this etching process leaves the bottom TiN anti-stiction layer 124 as the final surface material on the stopper feature 126. Thus, the stopper feature 126 generally has a small contact area as well as an anti-stiction coating in order to prevent stiction should the movable MEMS structure 111 make contact with the stopper feature 126.

Figure 3:
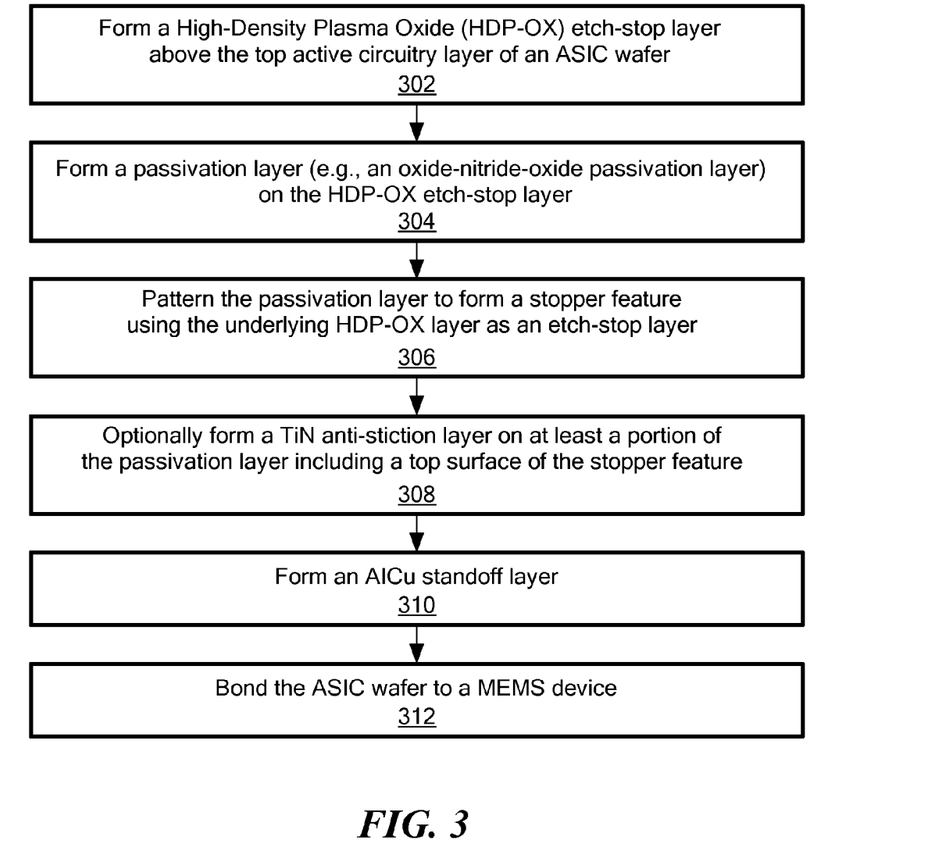
FIG. 3 is a logic flow diagram showing relevant steps in an ASIC fabrication process in accordance with the exemplary embodiment shown in FIG. 2.

FIG. 3 is a logic flow diagram showing relevant steps in an ASIC fabrication process in accordance with the exemplary embodiment shown in FIG. 2. In block 302, a High-Density Plasma oxide (HDP-OX) etch-stop layer is formed above the top active circuitry layer of an ASIC wafer. In block 304, a passivation layer (e.g., an oxide-nitride-oxide passivation layer) is formed on the HDP-OX etch-stop layer. In block 306, the passivation layer is patterned to form a stopper feature using the underlying HDP-OX layer as an etch-stop layer. In block 308, a TiN anti-stiction layer is optionally formed on at least a portion of the passivation layer including a top surface of the stopper feature. In block 310, an AlCu standoff layer is formed. In block 312, the ASIC wafer is bonded to a MEMS device.

It should be noted that the exemplary ASIC fabrication processes involving the HDP-OX, PECVD SiO2, PECVD SiN, TiN, and AlCu layers are typical ASIC fabrication processes and hence exemplary embodiments of the present invention are expected to be fabricated with little or no extra cost using existing ASIC fabrication machinery.

It should be noted that fabrication steps for forming the electrically conductive via 140 are omitted from FIG. 2 and FIG. 3 for the sake of simplicity, as formation of an electrically conductive via is generally known in the art. With regard to the exemplary embodiment shown in FIG. 1 and FIG. 2, generally speaking, the via 140 would involve various etching and deposition steps to etch through the HDP-OX layer 122 and the passivation layer 123 to form an opening extending from the top of the passivation layer 123 to the electrode 150 and fill the opening with an electrically conductive material (e.g., a W or tungsten metal); when the TiN layer 124 is formed, the TiN layer 124 would make contact with the electrically conductive via 140.

During operation of the integrated device having a MEMS device capped directly by an ASIC wafer, a fixed or variable electrical potential is typically placed on the TiN anti-stiction layer 125 (if present) using the electrically conductive via 140, e.g., to help prevent electrostatic attraction of the movable MEMS structure 111 to the stopper feature 126, thereby further reducing the chance for stiction of the movable MEMS structure 111 to the stopper feature 126.

It should be noted that the stopper feature 126 may be fabricated in virtually any size and/or shape as needed or desired for a particular application. Also, as discussed above, multiple stopper features may be fabricated using the processes described above, e.g., one or more stopper features placed opposite each of a number of movable MEMS structures. In embodiments having multiple stopper features, the ASIC wafer may be configured to allow different electrical potentials to be placed on different stopper features, e.g., to accommodate different biasing for different stopper features.

Figure 4:
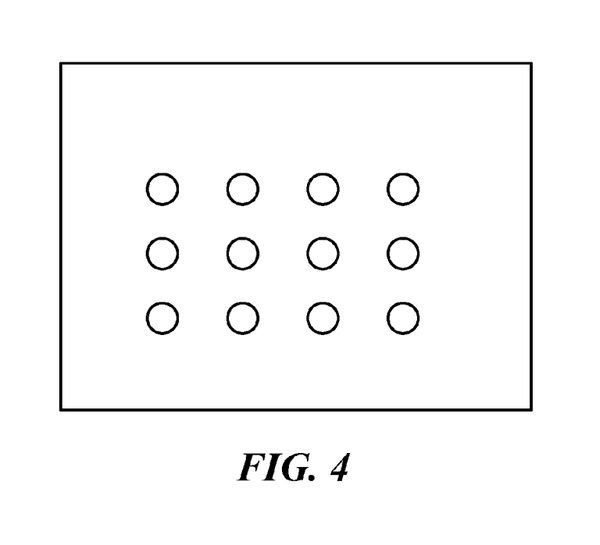
FIG. 4 is a schematic diagram showing an array of multiple small stopper features that may be used opposite a movable MEMS structure in place of one large stopper feature, in accordance with one exemplary embodiment.

FIG. 4 is a schematic diagram showing an array of multiple small stopper features that may be used opposite a movable MEMS structure in place of one large stopper feature, in accordance with one exemplary embodiment. Among other things, multiple small stopper features provides a smaller surface area than one large stopper feature and therefore reduces the chance for stiction to occur.

Figure 5:
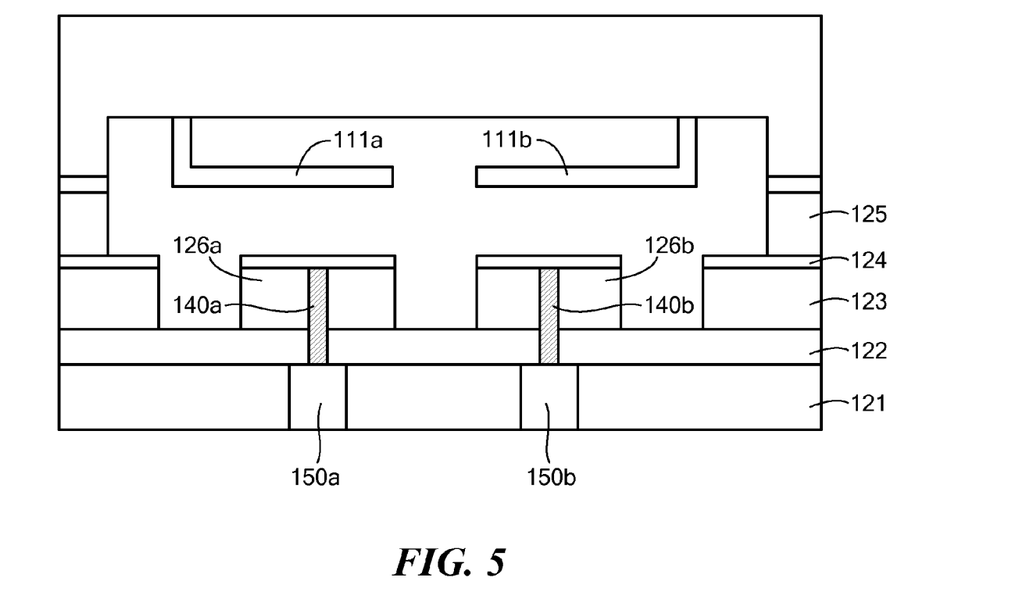
FIG. 5 is a schematic diagram showing multiple stopper features configured to allow a different electrical potential to be applied to each stopper feature, in accordance with one exemplary embodiment.

FIG. 5 is a schematic diagram showing multiple stopper features configured to allow a different electrical potential to be applied to each stopper feature, in accordance with one exemplary embodiment. In this example, there are two stopper features 126a and 126b placed opposite two movable MEMS structures 111a and 111b, respectively. Each stopper feature 126a and 126b includes a TiN anti-stiction coating, where the TiN anti-stiction coatings on the two stopper features are electrically insulated from one another. The TiN anti-stiction coating on each stopper feature 126a and 126b is electrically connected to a respective electrode 150a and 150b through a respective electrically conductive via 140a and 140b. The ASIC wafer may be configured to apply the same electrical potential to the two stopper features or may be configured to apply different electrical potentials to the two stopper features.

It should be noted that the MEMS device may by virtually any type of MEMS device having virtually any type(s) of movable MEMS structure(s). For example, the MEMS device may include an accelerometer having one or more movable proof masses, a gyroscope having one or more resonant masses, a microphone having one or more diaphragms, or other types of MEMS devices having other types of movable MEMS structures.

The present invention may be embodied in other specific forms without departing from the true scope of the invention, and numerous variations and modifications will be apparent to those skilled in the art based on the teachings herein. Any references to the "invention" are intended to refer to exemplary embodiments of the invention and should not be construed to refer to all embodiments of the invention unless the context otherwise requires. The described embodiments are to be considered in all respects only as illustrative and not restrictive.

What is claimed is:

1. A method for forming stopper features on an ASIC wafer to prevent over-range movement of a movable MEMS structure coupled to the ASIC wafer, the ASIC wafer including a top circuitry layer, the method comprising:
   forming an HDP-OX etch-stop layer above the top circuitry layer;
   forming a passivation layer on the HDP-OX etch-stop layer;
   selectively etching the passivation layer to form at least one selectively etched stopper feature comprising a remaining unetched portion of the passivation layer, wherein the HDP-OX etch-stop layer is an etch-stop layer for patterning the passivation layer; and
   positioning the movable MEMS structure on the ASIC wafer so that the at least one selectively etched stopper feature is opposite the movable MEMS structure within a range of movement of the movable MEMS structure to prevent over-range movement of the movable MEMS structure.

2. A method according to claim 1, wherein forming the passivation layer comprises forming a bottom oxide layer, a middle nitride layer, and a top oxide layer, and wherein selectively etching the passivation layer comprises:
   using a CF4 etchant containing H2 to selectively etch through the top oxide layer and the middle nitride layer; and
   introducing CHF3 or CH2F2 into the etchant to selectively etch through the bottom oxide layer to the HDP-OX layer.

3. A method according to claim 1, further comprising:
   forming a TiN anti-stiction coating on at least one stopper feature.

4. A method according to claim 3, further comprising:
   forming circuitry configured to place an electrical potential on the TiN anti-stiction coating.

5. A method according to claim 3, wherein forming a TiN anti-stiction coating on at least one stopper feature comprises forming a TiN anti-stiction coating on each of a plurality of stopper features.

6. A method according to claim 5, further comprising:
   wherein forming a TiN anti-stiction coating on each of a plurality of stopper features comprises forming at least two stopper features having TiN anti-stiction coatings that are electrically connected to one another, and wherein the method further comprises forming circuitry configured to place an electrical potential on the electrically connected TiN anti-stiction coatings; or
   forming a TiN anti-stiction coating on each of a plurality of stopper features comprises forming at least two stopper features having TiN anti-stiction coatings that are electrically isolated from one another, and wherein the method further comprises forming circuitry capable of placing different electrical potentials on the electrically isolated TiN anti-stiction coatings.

7. A method according to claim 1, further comprising:
   forming a plurality of AlCu standoffs.

8. An ASIC wafer having stopper features to prevent over-range movement of a movable MEMS structure coupled to the ASIC wafer, the ASIC wafer comprising:
   a top circuitry layer;
   an HDP-OX etch-stop layer formed above the top circuitry layer;
   a passivation layer formed on the HDP-OX etch-stop layer and including at least one selectively etched stopper feature comprising a remaining unetched portion of the passivation layer; and
   a movable MEMS structure positioned on the ASIC wafer so that the at least one selectively etched stopper feature is opposite the movable MEMS structure within a range of movement of the movable MEMS structure to prevent over-range movement of the movable MEMS structure.

9. An ASIC wafer according to claim 8, wherein the passivation layer comprises:
   a bottom oxide layer;
   a middle nitride layer; and
   a top oxide layer.

10. An ASIC wafer according to claim 8, further comprising:
    a TiN anti-stiction coating on at least one stopper feature.

11. An ASIC wafer according to claim 10, further comprising:
    circuitry configured to place an electrical potential on the TiN anti-stiction coating.

12. An ASIC wafer according to claim 10, comprising a TiN anti-stiction coating on each of a plurality of stopper features, wherein:
    at least two stopper features have TiN anti-stiction coatings that are electrically connected to one another and the ASIC wafer includes circuitry configured to place an electrical potential on the electrically connected TiN anti-stiction coatings; or
    at least two stopper features have TiN anti-stiction coatings that are electrically isolated from one another and the ASIC wafer includes circuitry capable of placing different electrical potentials on the electrically isolated TiN anti-stiction coatings.

13. An ASIC wafer according to claim 8, further comprising a plurality of AlCu standoffs.

14. An integrated wafer-level chip scale package device comprising an ASIC wafer coupled to a movable MEMS structure and wherein the ASIC wafer comprises:
    a top circuitry layer;
    an HDP-OX etch-stop layer formed above the top circuitry layer; and a passivation layer formed on the HDP-OX etch-stop layer and including at least one selectively etched stopper feature comprising a remaining unetched portion of the passivation layer positioned opposite the movable MEMS structure within a range of movement of the movable MEMS structure to prevent over-range movement of the movable MEMS structure.

15. An integrated wafer-level chip scale package device according to claim 14, wherein the passivation layer comprises:
   a bottom oxide layer;
   a middle nitride layer; and
   a top oxide layer.

16. An integrated wafer-level chip scale package device according to claim 14, further comprising:
   a TiN anti-stiction coating on at least one stopper feature.

17. An integrated wafer-level chip scale package device according to claim 16, further comprising:
   circuitry configured to place an electrical potential on the TiN anti-stiction coating.

18. An integrated wafer-level chip scale package device according to claim 16, comprising a TiN anti-stiction coating on each of a plurality of stopper features, wherein:
   at least two stopper features have TiN anti-stiction coatings that are electrically connected to one another and the device includes circuitry configured to place an electrical potential on the electrically connected TiN anti-stiction coatings; or
   at least two stopper features have TiN anti-stiction coatings that are electrically isolated from one another and the device includes circuitry capable of placing different electrical potentials on the electrically isolated TiN anti-stiction coatings.

19. An integrated wafer-level chip scale package device according to claim 14, further comprising a plurality of AlCu standoffs.

20. A method according to claim 1, wherein the movable MEMS structure is on a separate MEMS device wafer, and wherein positioning the movable MEMS structure on the ASIC wafer comprises bonding the separate MEMS device wafer to the ASIC wafer so that the at least one selectively etched stopper feature is opposite the movable MEMS structure within a range of movement of the movable MEMS structure to prevent over-range movement of the movable MEMS structure.

* * * * *